United States Patent [19]

Blank et al.

[11] 3,964,035

[45] June 15, 1976

[54] MAGNETIC DEVICES UTILIZING GARNET EPITAXIAL MATERIALS

[75] Inventors: Stuart Lawrence Blank, Madison; Roy Conway Le Craw, Summit, both of N.J.

[73] Assignee: Bell Telephone Laboratories, Incorporated, Murray Hill, N.J.

[22] Filed: Sept. 23, 1974

[21] Appl. No.: 508,071

[52] U.S. Cl. ........................ 340/174 TF; 252/62.57; 252/62.59

[51] Int. Cl.[2] .................... G11C 11/14; C04B 35/40

[58] Field of Search ............ 340/174 TF; 252/62.57, 252/62.59

[56] References Cited

UNITED STATES PATENTS 3,613,056 10/1971 Bobeck ......................... 340/174 TF 3,735,145 5/1973 Heinz ............................ 340/174 TF 3,886,533 5/1975 Bonner et al. ................ 340/147 TF

*Primary Examiner*—James W. Moffitt

*Attorney, Agent, or Firm*—G. S. Indig

[57] ABSTRACT

Members of a particular class of magnetic garnet compositions show characteristics useful for incorporation in magnetic memory devices which depend for their operation on the positioning of single wall domains ("bubbles"). Such compositions, ordinarily in the form of a supported layer, manifest high limiting bubble velocity, thereby making possible high record and access rates. Tetrahedral iron sites in the concerned compositions are occupied by non-magnetic ions in amount such as to result in magnetically balanced iron sub-lattices so that the magnetic moment contribution is made primarily by dodecahedral site ions. Europium is a necessary dodecahedral site occupant. High limiting velocity is attributed to the high value of the gyromagnetic ratio (*g* value) associated with europium.

11 Claims, 3 Drawing Figures

MAGNETIC DEVICES UTILIZING GARNET EPITAXIAL MATERIALS

BACKGROUND OF THE INVENTION

1. Field of the Invention

The invention is concerned with magnetic "bubble" devices. In particular, the invention is concerned with devices which include a supported layer of magnetic garnet material, generally, but not necessarily, on a non-magnetic garnet substrate. Such devices depend for their operation on nucleation and/or propagation of small enclosed magnetic domains of polarization opposite to that of the immediately surrounding material in the supported layer. Functions which may be performed include switching, memory, logic, etc.

2. Description of the Prior Art

For a number of years, there has been widespread interest in a class of memory or switching elements known as "bubble" devices. The term "bubble" is descriptive of the generally cylindrical form taken by the single wall domains, presence or absence of which constitutes the memory bits essential to operation. Such single wall domains, which may assume a variety of configurations, represent localized regions of one magnetic polarization within a surround of opposite polarization. Polarization, in either case, is largely orthogonal to a major surface of the device so that domains may be described as emergent--that is, with polarization "emerging" from a major plane. There is a vast body of literature on devices of this category. See, for example, Vol. MAG-5, IEEE Transactions on Magnetics page 544 (1969) and Scientific American, June (1971) p. 78–90.

Material requirements imposed on magnetic compositions have, in many respects, been more stringent than those imposed by other devices. For example, contemplation of domain or bit size of the order of a micrometer or less has carried with it the attendant requirement that material imperfections affecting nucleation or propagation be of a smaller size scale. Requirements on uniformity, both physical and compositional, have been legend, and solutions to these many problems have been impressive. Technology has resulted in development: of supposedly centrosymmetric garnets evidencing controllable and pronounced, unique easy directions of magnetization; of procedures for growing epitaxial layers of perhaps the highest physical and compositional uniformity yet seen under growth conditions considered a marked departure from all prior techniques; and of ancillary advances, e.g., concerned with fine scale access circuitry, lithographic techniques, etc. The program has already had and will continue to have widespread implications in a variety of arts.

It has been recognized for some time that a major material problem involves the precise manner in which the emergent domain is produced. Since garnet materials have been the leading contenders for bubble devices for some time, concern over emergence has generally been in terms of such materials. Two major approaches have been followed: the first, "growth induced anisotropy" relies on mixed population in a given crystallographic site, usually the dodecahedral site. Such mixed population of appropriate ions results in some form of local strain or preferential ordering attendant upon growth. Growth-induced unique easy direction is maintained at all but extremely high temperature (temperatures not ordinarily contemplated during use). Magnetic properties in growth-induced materials may, in selected compositions, be substantially temperature independent or may vary so as to match bubble properties to temperature in a desired manner. Characteristically, such compositions include praseodymium, neodymium, samarium, europium or terbium together with different rare earth (or yttrium) ion. Growth induced materials are eminently useful for many device designs.

A second approach makes use of massive strain ordinarily induced by a disparity between crystallographic lattice dimensions of supported layer and substrate. For example, supported epitaxial materials evidencing a negative value of magnetostriction, when supported on a substrate material of larger lattice dimension, show the emergent domain behavior. Best "strain induced" materials have, to date, had the advantage of somewhat increased domain wall mobility as contrasted with the growth induced material but have shown the disadvantage of significant temperature dependence of magnetic properties of concern in device operation.

Regardless of the mechanism/s responsible for the necessarily unique easy direction of magnetization, a characteristic of device concern is permitted speed of record and access. This parameter is ultimately dependent on the rate with which the bubble may be moved from any given position to an adjacent position. It, therefore, depends on such considerations as device design, traversal distance, and characteristics of auxiliary equipment, such as drive frequency.

Materials within which bubbles are nucleated and/or propagated are characterized by an inherent speed factor: mobility. This factor, when multiplied by the field in the material resulting from the applied drive field, results in a "velocity" term. In many of the materials used in the earlier stages of bubble devices, record and access time were limited by mobility. So, for example, materials containing substantial amounts of terbium in the dodecanedral site were typically characterized by mobility values of about 100 cm/sec/Oersted. Applied drive fields, conveniently at a level of perhaps 5 Oersteds, in consequence, resulted in velocities of about 500 cm/sec. As materials with higher mobility were designed, it was found that real rates of record or access were limited by another consideration. So, Samarium-containing materials, characterized by mobilities as high as 1300 cm/sec/Oersted, while yield velocities as high as 3000 cm/sec with relatively low drive fields, resulted in a loss of information as drive field was increased. Velocity limits generally did not exceed 1 megahertz operation. This is the frequency of field reversal and, therefore, the cycle time for movement of any given bubble to an adjacent position. For structures with position spacings of approximately 28 μm, this is equivalent to a velocity of 2900 cm/sec. Attempts to exceed such limiting velocities were found to result in loss of information. While the responsible mechanism has not been irrefutably established, it appears to involve a change in domain wall configuration, probably from a simple Bloch wall to a wall with a number of Block-to-Neel transitions. This characteristic, sometimes referred to as "dynamic conversion," results in bubbles which are "erratic" in that they do not follow the drive field in the predictable fashion of bubbles moving at lower velocities.

SUMMARY OF THE INVENTION

A critically defined class of garnet compositions is advantageously included as the functioning magnetic layer in magnetic memory devices. Such compositions permit rapid movement of domain walls which, in terms of bubble devices, results in high record and access rates. All included compositions are characterized by (1) presence of europium in the crystallographic dodecahedral site and (2) a relatively low magnetic moment contribution by the iron sub-lattices. In the usual compositions, preferred for these purposes, the low iron contribution is due to preferential replacement of tetrahedrally coordinated iron by non-magnetic ions to the extent necessary to result in a near balance in magnitude of the oppositely polarized octahedral and tetrahedral iron. An alternative takes the form of inclusion of magnetic ions in the dodecahedral sites. Such ions couple antiferromagnetically with tetrahedrally coordinated iron.

In all included compositions, the major magnetic moment contribution is desirably by the unique ion $Eu^{3+}$. As is discussed, deviation from these preferred compositions may result in retention of some lesser advantage as contrasted with some prior art materials but is generally justified only by other design considerations such as, lattice matching or desired degree of lattice mismatching.

For room temperature operation, optimum compositions contain 1.1 atom of diluent non-magnetic ions replacing tetrahedrally coordinated iron for each garnet formula unit (based on $RE_3Fe_5O_{12}$). This optimum substitution applies for ions, such as, $Si^{4+}$, $Ge^{4+}$, and $V^{5+}$, which effectively substitute exclusively for tetrahedrally coordinated iron. Gallium, which enters octahedral sites to a somewhat greater extent, is necessarily included in somewhat larger amount. Aluminum, for which complete compensation is not obtainable at room temperature, is not utilized as the sole iron diluent in compositions of the invention. While specific reference is not otherwise made to use of this ion, there may be occasion to include it as a partial substitution, for example, to satisfy lattice parameter requirements.

Compositions of the invention may be represented by the general formula:

$$Eu_x(Ca)_yRE_{3-x-y}(A)_zFe_{5-z}O_{12} ,$$

in which RE is yttrium, lanthanum, or a rare earth selected from the lanthanide series of element numbers 58-62 and 64-71 of the Periodic Table; in which A is at least one element selected from the group consisting of Si, Ge, Ga, Al, and V; $x$ is at least 0.5; $z$ is from 1.00–1.20 where A is Si, Ge, or V or a combination thereof, and $z$ is from 1.20 to 1.50 where A is Ga; in which $y$ is essentially equal to $z$ where A is Si, Ge, or a combination thereof and is equal to $2z$ where A is V.

The general formula is expressed in terms of calcium as the divalent cation required for valence balancing of the tetravalent $a$ ion. Calcium is certainly the most prevalent ion used for this purpose, and it is quite likely that compositions of the invention will utilize it alone for valence balancing. However, there are a number of other divalent or even monovalent ions that can also be utilized for valence balancing in whole or in part. For example, strontium, of somwhat larger ionic diameter than calcium, may be utilized in lieu of up to at least fifty percent of the calcium present. As with other variations in the formula, a general purpose for such replacement is to adjust the lattice parameter to more precisely match (or in the instance of strain-induced anisotropy to mismatch) with respect to the substrate within tolerance limits.

It should be stressed that the characteristic upon which the invention is based is the increased limiting velocity which comes about by virtue of the two factors set forth: (1) zero or small magnetic moment contribution due to the net differential between the anti-ferromagnetically coupled iron sublattices (generally, 25 percent or less of the total magnetic moment at room temperature is due to an imbalance in the iron sub-lattice moments themselves) and (2) presence of europium in the dodecahedral site in amount sufficient to result in a moment ($4\pi M$) of at least about 80 Gauss--a moment which results from inclusion of the minimum europium content specified in the above formula.

This increase in limiting velocity coincides with an effective $g$ factor numerically equal to at least about 4. In general, deviations from compositions resulting in $g$ factors numerically less than 4 are undesired, even though some improvement in operating characteristics may be realized over typical prior art materials, which, in general, have $g$ factors of approximately two or less. Other compositional variations which may sometimes be made where considerations, such as lattice parameter, are controlling, are not discussed in further detail, since the advantages upon which the invention is premised are substantially lessened. The invention is described in terms of desired high $g$ compositions; and for these purposes, it may be considered that deviations to satisfy other requirements result in mixed compositions of which high $g$ materials within the formula are a major constituent.

DETAILED DESCRIPTION

1. The Figures

Figure 1:
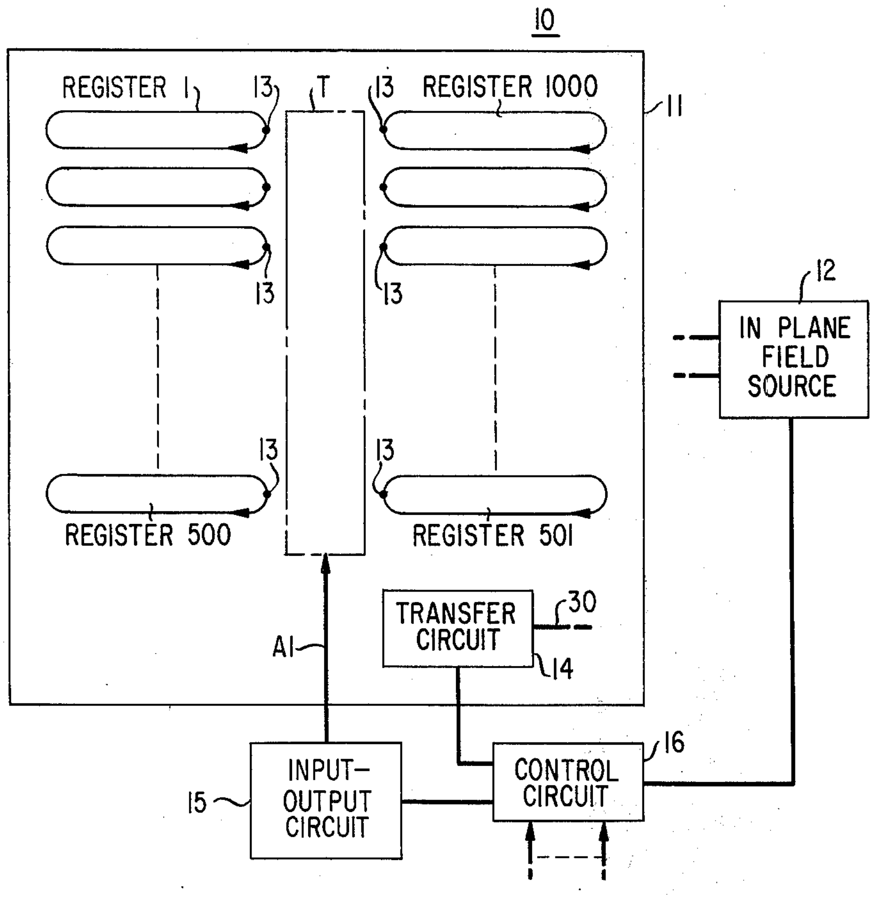
FIG. 1 is a schematic diagram of a recirculating memory in accordance with the invention.
Figure 2:
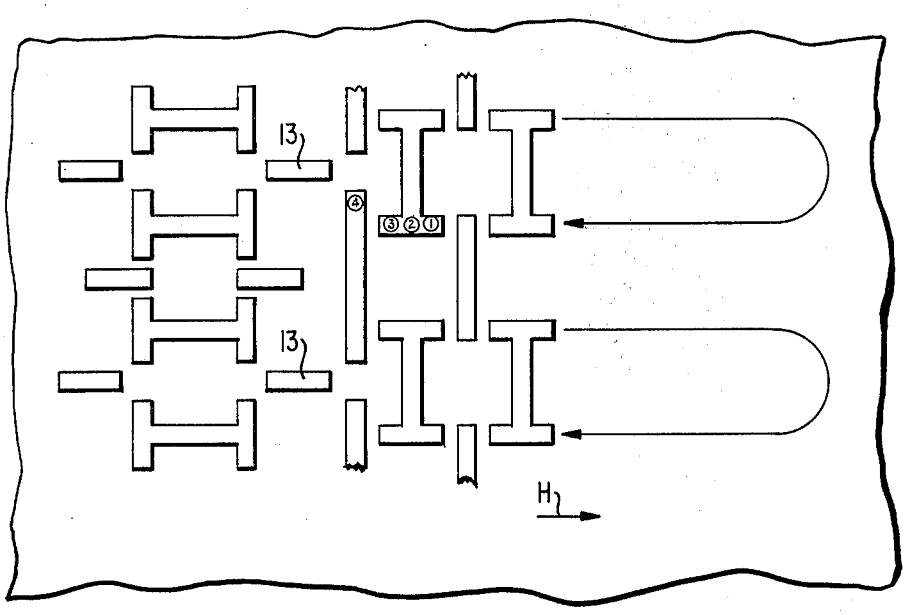
FIG. 2 is a detailed magnetic overlay and wiring configuration for portins of the memory of portions 1 showing domain locations during operation.

The device of FIGS. 1 and 2 is illustrative of the class of "bubble" devices described in IEEE Transactions on Magnetics, Vol. MAG-5, No. 3, September 1969, pp. 544–553, in which switching, memory and logic functions depend upon the nucleation and propagation of enclosed, generally cylindrically shaped, magnetic domains having a polarization opposite to that of the immediately surrounding area. Interest in such devices centers, in large part, on the very high packing density so afforded, and it is expected that commercial devices with from $10^5$ to $10^7$ bit positions per square inch will be commercially available. The device of FIGS. 1 and 2 represents a somewhat advanced stage of development of the bubble devices and includes some details which have been utilized in recently operated devices.

FIG. 1 shows an arrangement 10 including a layer 11 of material in which single wall domains can be moved. The movement of domains, in accordance with this invention, is dictated by patterns of magnetically soft overlay material in response to reorienting in-plane fields. For purposes of description, the overlays are bar and T-shaped segments and the reorienting in-plane field rotates clockwise in the plane of sheet 11 as viewed in FIGS. 1 and 2. The reorienting field source is represented by a block 12 in FIG. 1 and may comprise mutually orthogonal coil pairs (not shown) driven in quadrature, as is well understood. The overlay configuration is not shown in detail in FIG. 1. Rather, only closed "information" loops are shown in order to permit a simplified explanation of the basic organization in accordance with this invention unencumbered by the details of the implementation. We will return to an explanation of the implementation hereinafter.

The figure shows a number of horizontal closed loops separated into right and left banks by a vertical closed loop as viewed. It is helpful to visualize information, i.e., domain patterns, circulating clockwise in each loop as an in-plane field rotates clockwise.

The movement of domain patterns simultaneously in all the registers represented by loops in FIG. 1 is synchronized by the in-plane field. To be specific, attention is directed to a location identified by the numeral 13 for each register in FIG. 1. Each rotation of the in-plane field advances a next consecutive bit (presence or absence of a domain) to that location in each register. Also, the movement of bits in the vertical channel is synchronized with this movement.

In normal operation, the horizontal channels are occupied by domain patterns and the vertical channel is unoccupied. A binary word comprises a domain pattern which occupies simultaneously all the positions 13 in one or both banks, depending on the specific organization, at a given instance. It may be appreciated that a binary word so represented is fortunately situated for transfer into the vertical loop.

Transfer of a domain pattern to the vertical loop, of course, is precisely the function carried out initially for either a read or a write operation. The fact that information is always moving in a synchronized fashion permits parallel transfer of a selected word to the vertical channel by the simple expedient of tracking the number of rotations of the in-plane field and accomplishing parallel transfer of the selected word during the proper rotation.

The locus of the transfer function is indicated in FIG. 1 by the broken loop T encompassing the vertical channel. The operation results in the transfer of a domain pattern from (one or) both banks of registers into the vertical channel. A specific example of an information transfer of a one thousand bit word necessitates transfer from both banks. Transfer is under the control of a transfer circuit represented by block 14 in FIG. 1. The transfer circuit may be taken to include a shift register tracking circuit for controlling the transfer of a selected word from memory. The shift register, of course, may be defined in material 11.

Once transferred, information moves in the vertical channel to a read-write position represented by vertical arrow A1 connected to a read-write circuit represented by block 15 in FIG. 1. This movement occurs in response to consecutive rotations of the in-plane field synchronously with the clockwise movement of information in the parallel channels. A read or write operation is responsive to signals under the control of control circuit 16 of FIG. 1 and is discussed in some detail below.

The termination of either a write or a read operation similarly terminates in the transfer of a pattern of domains to the horizontal channel. Either operation necessitates the recirculation of information in the vertical loop to positions (13) where a transfer operation moves the pattern from the vertical channel back into appropriate horizontal channels as described above. Once again, the information movement is always synchronized by the rotating field so that when transfer is carried out appropriate vacancies are available in the horizontal channels at positions 13 of FIG. 1 to accept information. For simplicity, the movement of only a single domain, representing a binary one, from a horizontal channel into the vertical channel is illustrated. The operation for all the channels is the same as is the movement of the absence of a domain representing a binary zero. FIG. 2 shows a portion of an overlay pattern defining a representative horizontal channel in which a domain is moved. In particular, the location 13 at which domain transfer occurs is noted.

The overlay pattern can be seen to contain repetitive segments. When the field is aligned with the long dimension of an overlay segment, it induces poles in the end portions of that segment. We will assume that the field is initially in an orientation as indicated by the arrow H in FIG. 2 and that positive poles attract domains. One cycle of the field may be thought of as comprising four phases and can be seen to move a domain consecutively to the positions designated by the encircled numerals 1, 2, 3, and 4 in FIG. 2, these positions being occupied by positive poles consecutively as the rotating field comes into alignment therewith. Of course, domain patterns in the channels correspond to the repeat pattern of the overlay. That is to say, next adjacent bits are spaced one repeat pattern apart. Entire domain patterns representing consecutive binary words, accordingly, move consecutively to positions 13.

The particular starting position of FIG. 2 was chosen to avoid a description of normal domain propagation in response to rotating in-plane fields (considered unnecessary to this description). The consecutive positions from the right as viewed in FIG. 2 for a domain adjacent the vertical channel preparatory to a transfer operation are described. A domain in position 4 of FIG. 2 is ready to begin its transfer cycle.

Figure 3:
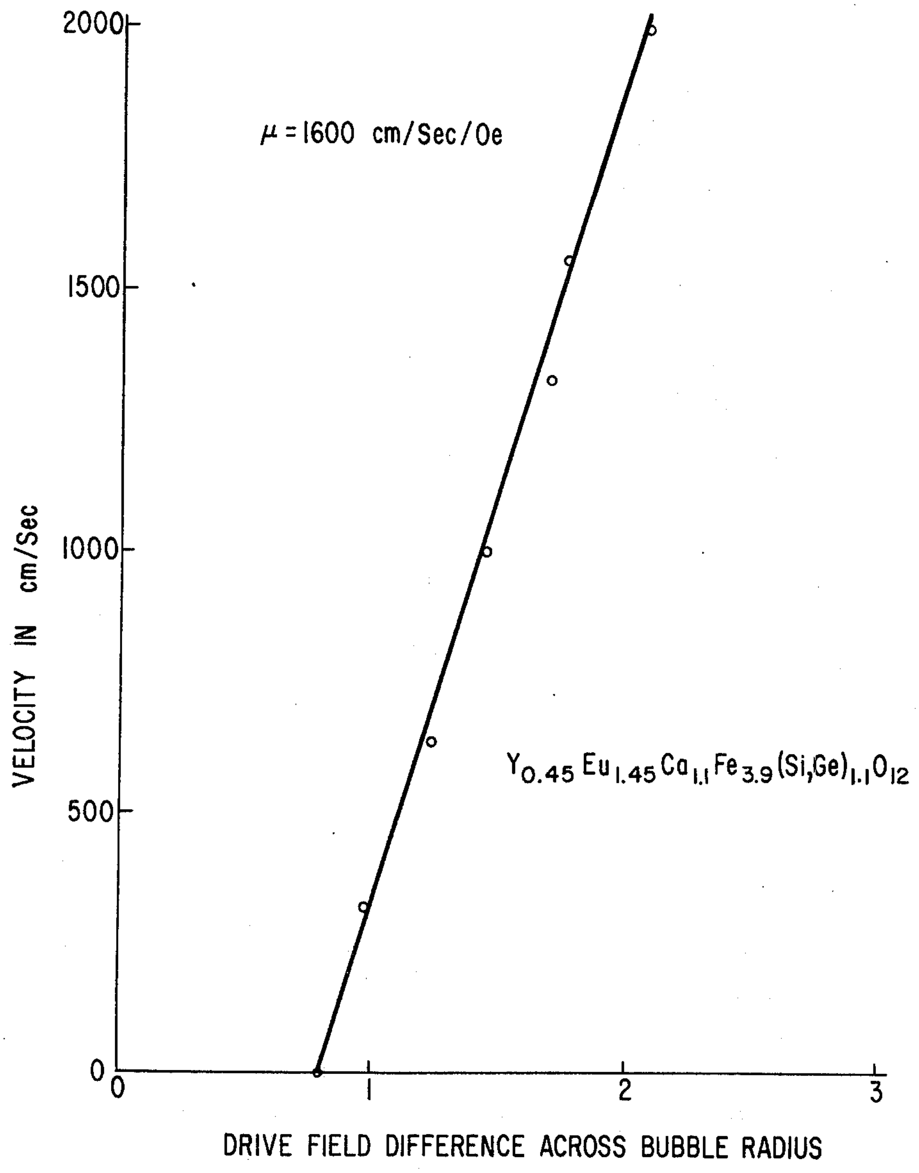
FIG. 3 is a plot which relates domain wall velocity to drive field for an epitaxial layer of the composition $Y_{0.45}Ca_{2.1}Eu_{1.45}(Si,Ge)_{1.1}Fe_{3.9}O_{12}$ on a substrate of $Gd_3Ga_5O_{12}$. Magnetization, $4\pi M$, is approximately 200 Gauss.

FIG. 3 relates domain wall velocity to drive field for a film of $Y_{0.45}E_{1.45}Ca_{1.1}(Si,Ge)_{1.1}Fe_{3.9}O_{12}$ on $Gd_3Ga_5O_{12}$. The slope of the curve shows that mobility is ~1600 cm/sec × Oe. in this material.

2. Composition

Garnets suitable for the practice of the invention are of the general stoichiometry of the prototypical compound $Y_3Fe_5O_{12}$. This is the classical yttrium iron garnet (YIG) which, in its unaltered form, is ferrimagnetic with net moment being due to the predominance of one iron ion per formula unit in the tetrahedral site. In this prototypical compound, yttrium occupies a dodecahedral site. The primary composition requirement, in accordance with the invention, is concerned with the nature of the ions in part replacing iron in the tetrahedral sites to reduce magnetization.

As discussed under the *Summary* of the *Invention*, preferred compositions may be represented by the formula: $Eu_x(Ca)_yRE_{3-x-y}(A)_zFe_{5-z}O_{12}$, in which RE is yttrium, lanthanum, or a rare earth selected from the lanthanide series of element numbers 58-62 and 64-71 of the Periodic Table; in which A is at least one element selected from the group consisting of Si, Ge, Ga, Al, and V; $x$ is at least 0.5; $z$ is from 1.00–1.20 where A is Si, Ge, or V or a combination thereof and $z$ is from 1.20 to 1.50 where A is Ga; in which $y$ is essentially equal to $z$ where A is Si, Ge, or a combination thereof and is equal to 2z where A is V.

The general formula is expressed in terms of calcium as the divalent cation required for valence balancing of the tetravalent $a$ ion. Calcium is certainly the most prevalent ion used for this purpose, and it is quite likely that compositions of the invention will utilize it alone for valence balancing. However, there are a number of other divalent or even monovalent ions that can also be utilized for valence balancing in whole or in part. For example, strontium, of somewhat larger ionic diameter than calcium, may be utilized in lieu of up to at least 50 percent of the calcium present. As with other variations in the formula, a general purpose for such replacement is to adjust the lattice parameter to more precisely match (or in the instance of strain-induced anisotropy to mismatch) with respect to the substrate within tolerance limits.

It is known that garnet materials may be made to deviate from their classical isotropic characterization by either of, or a combination of, two mechanisms. One of these is due to strain, and here it is common to provide a magnetic layer having a lattice parameter which differs from the substrate material by from 0.015 A greater to 0.012 A smaller. Since the magnetostriction may vary in sign and amount (negative for small Eu to positive for large Eu) strain induced anisotropy may be introduced by deliberate mismatch (larger film lattice parameter for large Eu). A popular substrate material, gadolinium-gallium-garnet, (sometimes known as GGG) has a lattice constant of 12.383 A. Compositions such as $Y_3Fe_{5-x}Ga_xO_{12}$, $Y_{3-y}Gd_yFe_{5-x}Ga_xO_{12}$ on GGG are representative of this class of layer materials in which unique direction of easy magnetization is "strain induced." The other mechanism resulting during growth is therefore designated "growth induced" and is considered to be dependent upon mixed population and preferential ordering of dodecahedral site ions of specified relative characteristics designed to attain this purpose. Considerations necessary for selection of growth induced compositions within the formula are well known to those skilled in the art and are described in some detail in the patent and technical literature. See, for example, 17 Appl. Phys. Lett. 131 (1970). It is possible to identify relative contributions made by these two mechanisms experimentally. So, for example, appropriate heat treatment, for example, maintenance at a temperature of about 1250°C for a period of 24 hours usually results in randomization of dodecahedral site ions so that a composition once so treated will no longer manifest growth induced anisotropy upon cooling. In general, strain induced effects, being due to differences in lattice parameter and/or temperature dependence of expansivity, are unaffected by such treatment.

In general, materials which owe their necessary magnetic orientation to growth induced effects have been characterized by somewhat lower mobility values than the best of the strain induced materials. The characteristic with which the invention is primarily concerned, that of limited velocity tentatively ascribed to dynamic conversion, is, however, associated with materials of either type. It has been indicated that limiting velocity is, in part, design- and/or dimension-dependent, but that regardless of such considerations, there is invariably some limiting velocity beyond which devices have heretofore operated only imperfectly. In general, designs in use at this time have permitted maximum frequencies of only of about 1 megahertz—and there only for particular configurations. Such configurations are generally of the TX variety, as described in MAG.9, No. 4, IEEE Trans. Mag., p 708, Dec. 1973. The 1 megahertz operational frequency has not been generally attainable in chevron and T bar patterned devices. Use of materials of the invention have already permitted operation in the 1.7–2 megahertz range with no change in pattern design or dimensions. Permitted velocity has been shown to be increased for a variety of dimensions and configurations.

Considerations, some of which yielded the compositions upon which the formula limits are based, are briefly set forth.

Mobility is decreased by the larger electron orbital contributions of magnetic rare earth ions occupying dodecahedral sites. Yttrium and lutetium, being nonmagnetic, have little effect on mobility and are, from this standpoint, therefore, desirably included where other considerations dictate inclusion of non-europium trivalent ions in such sites. One of the poorer ions, from the mobility standpoint in this category, is terbium. Gadloinium, on the other hand, results in relatively small damping due to a lesser orbital contribution. From this standpoint, gadolinium, which like other of the included magnetic dodecahedral sites, couples antiferromagnetically with tetrahedrally coordinated iron ions, may be used to reduce net iron contribution.

Unsubstituted YIG has the highest mobility of the magnetic garnets—a value of perhaps 5,000 cm/sec/Oersted or greater. Terbium-containing materials may be characterized by mobilities of perhaps 100 cm/sec/Oersted or less. Holmium or samarium may reasonably be included where otherwise desired. Mobilities for such materials are characteristically in the range of from 300 to 1200 cm/sec/Oersted. Materials containing europium as the prime magnetic ion in the dodecahedral site may have mobilities of about 1600 cm/sec/Oersted or greater. Conveniently applied drive fields have been found to result in fields within the film which range from 5 to 10 Oersteds. These values are for devices which may utilize magnetic layers of approximately 4–6 $\mu$m in thickness with bubbles of about 6 $\mu$m in diameter and circuit periods--i.e., position spacings--of about 28 $\mu$m. Velocities of 8000–16000 cm/sec corresponding with 5 to 10 Oersteds drive respectively are generally attainable in preferred materials in accordance with the invention.

Temperature dependence, sometimes desirably at a minimum but more usually tailored to follow that of other magnetic elements, such as, the biasing magnet, may enter into choice of compositions within the formula. In general, gadolinium, while least harmful to mobility among the concerned lanthanide elements, with its strong temperature dependence due to its near-room temperature compensation point, may be undesirable.

From the standpoint of temperature dependence, europium is one of the more desirable magnetic lanthanide elements. For usual compositions in which approximately 1.1 atom of Fe is replaced by silicon or germanium, thereby resulting in the same number of calcium ions in the dodecahedral site, a preference is indicated for Y, Lu or La in addition to the indicated europium and calcium in the dodecahedral sites.

Iron dilution in the formula is based on assumed room temperature operation--i.e., operation within the range of from 10°–30°C. For perfect tetrahedral site dilution, exact compensation occurs very close to 1.095 atom silicon, germanium, or vanadium. Indicated limits, i.e., from 1.00–1.20, are generally based on permissible net iron lattice moment contribution. The lower limit of 1.00 at room temperature coincides with a moment contribution of approximately 100 Gauss from the iron sub-lattice imbalance. From the limiting velocity standpoint, there is no reason to go to lesser amounts of diluent. The iron lattice contribution is, under these circumstances, due to tetrahedrally coordinated iron and, therefore, is opposed to that of the europium contribution which, as indicated, couples antiferromagnetically with the tetrahedral iron. Where it is desired to operate at lesser moment values, this is desirably accomplished by diluting europium with non-magnetic ions, such as, yttrium or lutetium, thereby resulting in the desired magnetic characteristic without decreasing *g* factor. The indicated maximum of 1.18, in general, at room temperature coincides with an iron lattice contribution of approximately 100 Gauss, since this contribution is due to the octahedral iron sub-lattice, it is additive with the contribution made by europium (as well as other dodecahedral site magnetic ions). Where deliberate deviation is made from perfect iron lattice compensation, it is expected it will take the form of an increase rather than decrease in diluent (or, alternatively, in non-europium dodechedral site ions having the equivalent effect). The room temperature limit of 1.20 may, for silicon and/or germanium substitution, result in a total moment of about 500 Gauss. Exceeding this limit results in further reduction of *g* factor from the value of approximately 4 represented by the dilution of 1.20 in this site.

The limits on the europium content as related to other compositional variants in the formula derive from a consideration of bubble device operation. Such devices, as presently constituted, and anticipating certain future design changes, utilize or may be expected to utilize net magnetic moment $4\pi M$ within the range of from 100 Gauss to about 500 Gauss. It is implicit in previous discussion that, at least for compositions in which iron sub-lattice balance is accomplished by means of ions of valence greater than 3, total net moment in the optimum composition, i.e., the composition with exact iron sub-lattice compensation, is less than the upper number of 500 Gauss. This was taken into account in defining an upper diluent limit with a greater departure from the optimum than the minimum. Assuming a perfectly balanced iron lattice, a net moment value of approximately 430 Gauss results for the composition in which dodecahedral sites are occupied solely by the necessary compensating quantity of calcium and europium—i.e., for 1.1 calcium and approximately 1.9 europium. The lower limit of 0.5 europium corresponds with a moment of about 100 Gauss. In terms of present bubble device configurations, a moment of 100 Gauss corresponds with a bubble diameter of about 10 $\mu m$, and a moment of 500 Gauss corresponds with a bubble device diameter of approximately 2–3 $\mu m$. In one experiment, use of 1.45 europium together with 1.1 calcium (and 0.45 of the non-magnetic ion $Y^{3+}$) resulted in a bubble diameter of 5.2 $\mu m$ in a supported layer of thickness of 4.2 $\mu m$.

Silicon and germanium are, in general, the preferred iron diluent ions. It has been indicated that at room temperature it requires but 1.1 atom of either of these substituent ions to balance the iron sub-lattices. This, or course, gives rise to the need for an equivalent amount of divalent ion to valence balance, and in turn results in an upper limit of 1.9 atom of europium. The formula provides for the possibility of iron dilution by means of $Ga^{3+}$. Since this requires no valence compensation, all dodecahedral sites may be occupied by $Eu^{3+}$, thereby yielding a moment, $4\pi M$, approximately equal to 400 Gauss. Gallium, while showing a strong preference for tetrahedral site occupancy, is not as selective as silicon or germanium; and compensation in the iron sub-lattices is attained only by use of about 1.35 atom $Ga^{3+}$. This results in increased temperature dependence of $4\pi M$ due to the greater lowering of Curie point. Aluminum, a well-known diluent for reducing moment in garnet compositions, is not useful for optimum materials designed for operation at room temperature. It is not known that compensation of iron sub-lattices has ever been attained by use of aluminum alone in this temperature range. The possibility exists of partial use of this diluent to satisfy some overriding desire, such as lattice matching. Vanadium shows a strong preference for tetrahedral site occupancy and may be favorably compared with Si/Ge on this basis. The disadvantage for vanadium, from the compositional standpoint, derives from the need for twice as much divalent calcium or other divalent ion for compensation, thereby setting a lower limit for europium content. As a first approximation, complete compensation by this pentavalent ion also occurring at about 1.1 atom requires 2.2 atom $Ca^{2+}$ and, therefore, permits a maximum of only 0.8 $Eu^{3+}$. This is still a useful composition for low moment materials but at least, as presently contemplated, is not useful for small bubble diameter designs which now require moments greater than attainable at 0.8 $Eu^{3+}$.

To date, reported compositions including tetrahedral/octahedral site ions of a valence greater than 3 have depended upon $Ca^{2+}$ for valence balancing. It is to be recognized that this element makes no magnetic contribution nor does it otherwise affect performance of any contemplated device and is considered exemplary only.

In general, where it is desirable to reduce moment, this is achieved by increasing non-magnetic dodecahedral ion content. Best known examples are yttrium and lutetium. Alternatives may include other non-magnetic ions, such as, $Bi^{3+}$. (In all of the above, implicit consideration is given to facility of growth. Bismuth, like other ions discussed, has been included both in single phase ceramics and in single crystals of otherwise relevant garnet compositions.)

No attempt at exhaustive coverage in terms of an atom formula is likely to be perfect. Certain devices have been indicated; others are apparent. For example, the assumption has been made implicitly that device operation will be at or near room temperature. While operation may stray considerably without a large-scale effect on device characteristics for most of the included compositions, the inventive requirements may more closely be approached with some compositional variation for other temperatures. It is well known, for example, that more perfect preferential site occupancy occurs for decreasing temperature. (The iron sub-lattice is perfectly balanced with precisely 1.0 atom of the diluent ions Si and/or Ge at 0°K.)

3. Growth

Discussion has been in terms of supported films of the concerned compositions; and present and contemplated devices, at least in the bubble memory category, are dependent on this structure. Nevertheless, these and other devices may utilize thin self-supported sheets of bulk material which may conceivably be polycrystalline. Growth procedures are well known and include the various ceramic processes, such as, conventional ball milling and firing, freeze drying or solution drying, bulk crystal growth from fluxes such as lead oxide, lead oxide-boron-oxide, lead oxide-lead-fluoride, lead oxide-boron-oxide-lead fluoride, bismuth oxide, etc. Supported film growth, for best physical and compositional uniformity, is generally dependent upon procedures in which nucleation occurs simultaneously at many sites. Procedures which have been utilized include tipping, and immersion and extraction. Both of these procedures are flux growth procedures; the first utilizing a non-wetting flux containing boron oxide and lead oxide, and the second utilizing boron oxide and bismuth oxide. To date, the most satisfactory procedure for supported growth epitaxial films is by super-cooled growth. Here, a substrate is immersed in a supersaturated solution equivalent to super-cooling of at least 5°C, and substrate, together with grown film, are extracted after a short immersion period. See, for example, 19, Appl. Phys. Letts. 486 (1971).

Growth has generally been on gadolinium-gallium-garnet substrates (GGG). Growth procedures for this excellent substrate material are at a high level of development. The lattice parameter of GGG, 12.383 A, is within a range which permits either the extremely close matching desired for solely growth induced anisotropy or the still approximate matching for strain induced anisotropy. Work reported in the examples did utilize this substrate material. The substrate, however, plays no necessary active role in device performance; and any material permitting epitaxial film growth may be utilized.

4. Concerned Mechanism

It is postulated and, to a large degree, substantiated experimentally that the improved limiting velocities permitted in the inventive compositions are the result of higher *g* factors. The *g* factors for typical non-europium-containing garnet compositions, as well as for europium compositions for which iron sub-lattices are not balanced, are generally at a numerical level of two or less. Compositional limits in the formula under section "2. Composition" generally result in a minimum *g* factor of about four. Actual experimental measurements have yielded *g* factors of thirty (for the nominal composition $Y_{0.45}Ca_{1.1}Eu_{1.45}(Si,Ge)_{1.1}Fe_{3.9}O_{12}$). Since $Eu^{3+}$ has an angular momentum of zero, perfect iron sub-lattice compensation can, in principle, yield extremely high *g* factors. Iron sub-lattice compensation to minimize angular momentum and, thereby, permit a larger *g* factor is discussed in Microwave Ferrites and Ferrite Magnetics, Lax and Button, McGraw Hill Book Company, Inc. (1962) pages 248 et seq. The value of $g_{eff}$, that is, the effective gyromagnetic ratio, is given by the ratio of the net magnetization to the net angular momentum in accordance with the formula:

$$g_{eff} = \frac{\Sigma M_i}{\Sigma \frac{M_i}{g_i}}$$

in which the index *i* denotes the particular magnetic sub-lattice; $M_i$ represents the magnetization; and $g_i$ is the gyromagnetic ratio of the $i^{th}$ sub-lattice. This is a simple formula representation of the general description above. Further details are considered outside the necessary scope of this description and may be found, for example, in the cited text.

5. Examples

Usefully, from the standpoint of comparison, films reported in the accompanying Examples were grown by the same or similar techniques. All, unless otherwise noted, are of the approximate thickness of 4–6 μm; all were grown on GGG. The following table tabulates some illustrative compositions.

Example 4 is included for reference purposes. This is a promising material under study, and may be considered as representative of the best device grade materials previously available for bubble device use. In Examples 1 and 2 measured results were reliably extrapolated to predict $10^{14}$ bubble steps without signal deterioration. By comparison, the signal in Example 4, for the same configuration, was degraded to an unusable level after approximately $10^7$ bubble steps at a frequency of 1.0 MHz.

| Example | Composition | Lattice Parameter $\Delta a_o$ re GGG | g | Mobility (cm/sec. Oe.) | Limiting Velocity (cm/sec.) |
|---|---|---|---|---|---|
| 1 | $Y_{0.45}Ca_{1.1}Eu_{1.45}(Si,Ge)_{1.1}Fe_{3.9}O_{12}$ | 12.385 | >25 | ~1600 | >70000 |
| 2 | $Eu_{1.7}Lu_{0.3}Gd_1Fe_{4.3}Ga_{0.7}O_{12}$ | 12.4802 | >20 | 1300 | >50000 |
| 3 | $Eu_{1.8}Ca_{1.2}Fe_{3.8}(Si,Ge)_{1.2}O_{12}$ | 12.382 | 4 | ~1600 | ~7000 |
| 4 | $Y_{1.92}Sm_{0.1}Ca_{0.98}Ge_{0.98}Fe_{4.02}O_{12}$ | 12.383 | ~2 | ~1500 | ~3500 |

What is claimed is:

1. Memory device comprising a substrate supporting at least a first epitaxial layer, the said layer being capable of evidencing uniaxial magnetic anisotropy capable of supporting local enclosed regions of magnetic polarization opposite to that of surrounding material, provided with first means for magnetically biasing said layer to stabilize said regions, second means for positioning such oppositely polarized local and enclosed regions, and third means for propagating such local regions, said material being of the garnet structure, characterized in that at least 75 percent of the total net moment of the material is contributed by europium as a dodecahedral site occupant, the said net moment being at least 100 Gauss.

2. Memory device of claim 1 in which the magnetic moment 4πM of the said first layer is from about 100 Gauss to 500 Gauss.

3. Memory device of claim 2 in which the magnetic moment contribution of the iron sub-lattice is reduced by partial substitute of iron by at least one of the ions selected from the group consisting of $Si^{4+}$, $Ge^{4+}$, $V^{5+}$, and $Ga^{3+}$.

4. Memory device of claim 3 in which valence compensation is accomplished by inclusion of $Ca^{2+}$ as a partial dodecahedral site occupant.

5. Memory device of claim 4 in which the said unaxial magnetic anisotropy is at least partially growth induced.

6. Memory device of claim 4 in which the said unaxial magnetic anisotropy is at least partially strain induced.

7. Memory device of claim 1 in which the composition of the said material of the said first layer may be represented by the atom formula: $Eu_xCa_yRE_{3-x-y}(A)_z Fe_{5-z}O_{12}$, in which RE is yttrium, lanthanum, or a rare earth selected from the lanthanide series of element numbers 58-62 and 64-71 of the Periodic Table; in which A is at least one element selected from the group consisting of Si, Ga, Ge, Al, and V; $x$ is at least 0.5; $z$ is from 1.00–1.20 where A is Si, Ge, or V, or a combination thereof and $z$ is from 1.20–1.50 where A is Ga; in which $y$ is essentially equal to $z$ where A is Si, Ge, or a combination thereof and is equal to 2z where A is V.

8. Memory device of claim 7 in which A is silicon or germanium and in which $z$ is approximately equal to 1.1.

9. Memory device of claim 7 in which the said substrate consists essentially of a material of the atom formula $Sm_3Ga_5O_{12}$.

10. Memory device of claim 7 in which the said substrate consists essentially of a material of the atom formula $Gd_3Ga_5O_{12}$.

11. Memory device of claim 10 in which $a_o$ of the said first layer is within the range of from 12.370 A to 12.401 A.

* * * * *

UNITED STATES PATENT AND TRADEMARK OFFICE

CERTIFICATE OF CORRECTION

PATENT NO. : 3,964,035

DATED : June 15, 1976

INVENTOR(S) : Stuart L. Blank and Roy C. Le Craw

It is certified that error appears in the above-identified patent and that said Letters Patent are hereby corrected as shown below:

Column 4, line 40, "portins" should be --portions--, before "1", delete "portions" and substitute therefor --FIG.--. Column 8, line 27, "Gadloinium" should be --Gadolinium--. Column 10, line 19, "mement" should be --moment--.

Signed and Sealed this

Twenty-eighth Day of December 1976

[SEAL]

*Attest:*

RUTH C. MASON
*Attesting Officer*

C. MARSHALL DANN
*Commissioner of Patents and Trademarks*